United States Patent [19]

Myers

[11] 4,053,790

[45] Oct. 11, 1977

[54] POWER LINE SWITCH WITH TIME DELAY TURN OFF

[75] Inventor: Harold Edward Myers, St. Joseph, Mich.

[73] Assignee: Heath Company, Benton Harbor, Mich.

[21] Appl. No.: 719,302

[22] Filed: Aug. 31, 1976

[51] Int. Cl.² .......................................... H03K 17/26
[52] U.S. Cl. ................................. 307/141.4; 307/293
[58] Field of Search ................... 307/293, 246, 141.4, 307/141.8, 141

[56] References Cited

U.S. PATENT DOCUMENTS 3,033,998  5/1962  Nellis ............................. 307/293 X
3,745,382  7/1973  Hoge et al. ........................ 307/293

Primary Examiner—Herman J. Hohauser
Attorney, Agent, or Firm—W. R. Sherman; K. McMahon; J. J. Kaliko

[57] ABSTRACT

A time delay switch is disclosed for permitting a load to be powered over a preselected period of time. The switch automatically cuts off power to the load when the period expires. The disclosed switch draws no power in its "Power Cut-Off" state thereby conserving the life of the power source. In addition to being power conservative the disclosed switch features rapid power turn on, emergency power cut off and is capable of being operative in its "Power On" state over relatively long periods of time.

7 Claims, 1 Drawing Figure

U.S. Patent  Oct. 11, 1977  4,053,790
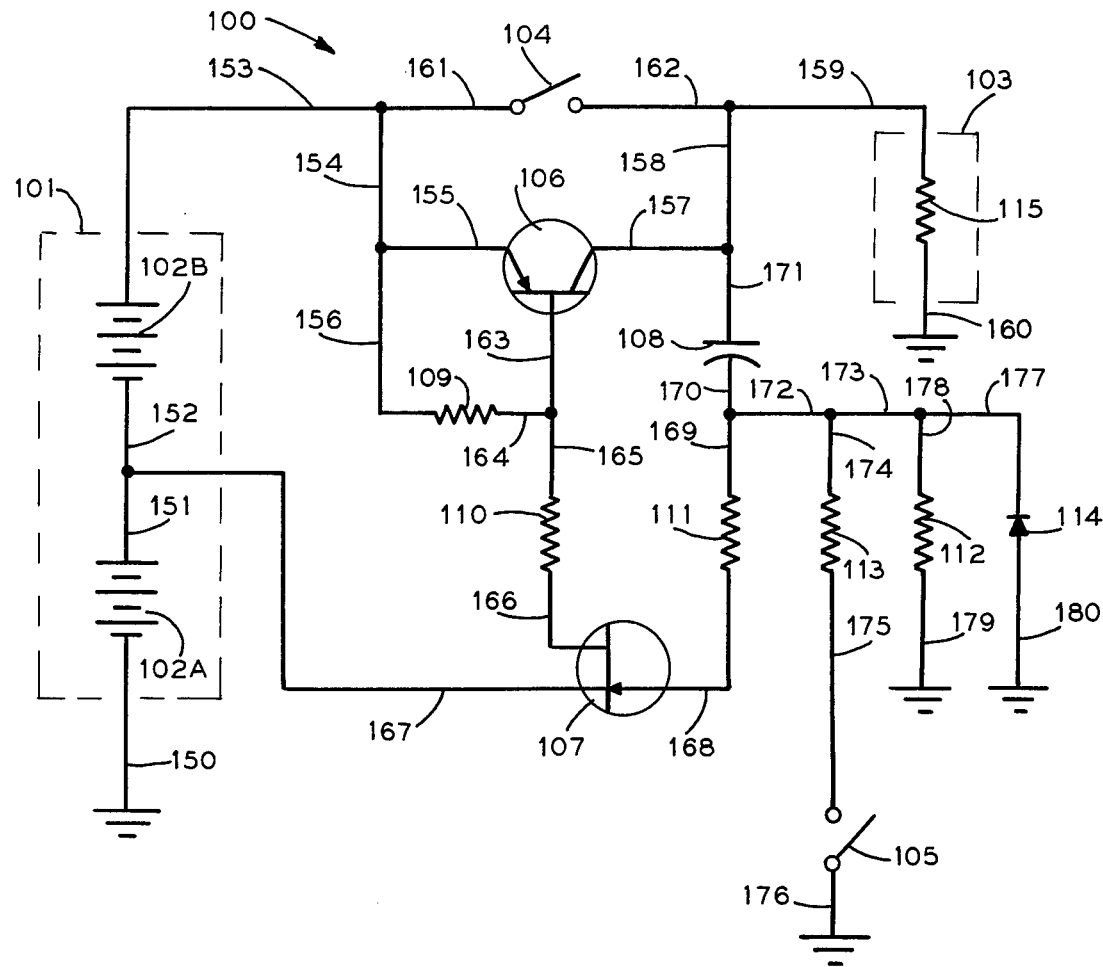

POWER LINE SWITCH WITH TIME DELAY TURN OFF

BACKGROUND OF THE INVENTION

1. Field of the Invention

This invention relates to power line switch devices in general and more particularly to time delay power line switch devices.

2. Brief Description of the Prior Art

Power line switches are very well known devices. An ordinary lamp switch is an example of a two state, on-/off, power line switch. Such switches are generally placed in the desired on or off state manually.

Other switches are known which eliminate the need for manual interaction to cut power. These automatic devices typically cut power off from a load at the expiration of a predetermined time period. A combination of a capacitive element, with known discharge characteristics, and a number of transistors, with known cut-off characteristics, is typically employed to realize an automatic switch. The transistors in such a device are controlled by the amount of charge on the capacitive element over time. While the capacitive element is in the process of, for example, being discharged according to its known characteristics, the transistors may be maintained in their conductive state (usually associated with the on state of the switch) permitting the load to receive power from the power source. The cut-off characteristics of the transistors and the discharge characteristics of the capacitor combined effectively determine a time interval, variable by the switch designer, for maintaining the switch in its on state.

At some point in time the charge on the capacitor causes transistor cut-off placing the transistors in their nonconductive state (usually associated with the off state of the switch) to effectively prevent power from reaching the load. Thus the switch automatically enters its off state.

Examples of automatic cut-off type switches employing a capacitive discharge type time delay may be seen in Smith, U.S. Pat. No. 3,480,801, issued Sept. 27, 1965; Prapis, U.S. Pat. No. 3,210,613, issued Oct. 5, 1965; Yello, U.S. Pat. No. 3,509,361, issued Apr. 28, 1970; and Mitchell, U.S. Pat. No. 3,621,276, issued Nov. 16, 1971.

Other known prior art devices attempt to accomplish automatic time delay power cut-off switching with a minimal number of switch components. Obviously, it is desirable from both economic and reliability standpoints to minimize the number of components in a switch. Nellis, U.S. Pat. No. 3,033,998, issued May 8, 1962 teaches such a minimal configuration utilizing only two transistors in combination with a capacitor. The Nellis switch is normally de-energized with both transistors non-conducting. When a relatively short duration pulse is supplied to the switch the two transistors are driven into saturation and supply current to the load through one of the transistors. The Nellis switch has a timing circuit (which includes the capacitor) for maintaining the switch in the on state for a predetermined period.

All of the known prior art time delay switches draw current from the power source when the circuit is inactive, i.e., when the switch is in the off state. This continuous power drain results in frequently having to rejuvinate or replace the power source, typically a battery.

In addition to not being power conservative, the known minimal configuration time delay cut-off switches are capable of remaining in their on state for only short peirods of time. This is due to the fact that the known switches employ bipolar transistors having low input impedances to define the time interval over which the switch remains in the on state.

In light of these problems, it is an object of the invention to provide a power conservative time delay cut-off switch which eliminates the need for frequent rejuvination or replacement of the power source due to the drain placed on the power source by known switching devices.

It is a further object of the invention to provide a power conservative time delay cut-off switch having a minimum number of components.

Still further, it is an object of the invention to provide a power conservative time delay cut-off switch which is capable of operating in its on state over relatively long periods of time.

SUMMARY OF THE INVENTION

According to the preferred embodiment of the invention two transistors and a capacitor are resistively combined to form the minimal component time delay cut-off switch having no closed circuit which include the power source while the switch is in its off state.

The first of the two transistors when in its conductive state serves to couple the load directly to the power source.

The second transistor serves as a control device which in its conductive state forces the first transistor into saturation.

The capacitor is coupled to the second transistor and varies the conductivity state (conductive or non-conductive) of the second transistor as a function of the charge on the capacitor. The capacitor maintains the second transistor in its conductive state from initialization of the on switch state until the expiration of a time interval principally predetermined by the characteristics of the capacitor and a resistance through which the capacitor is charged. Upon expiration of the predetermined period, the second transistor is rendered nonconductive and is maintained in that state by the charge on the capacitor.

Upon being rendered non-conductive, the second transistor immediately renders the first transistor non-conductive, thereby preventing power from reaching the load. Thus, power cut off is automatically achieved at the expiration of the predetermined period.

Power is conserved by the switch since no closed circuit paths include the power source when the switch is off. Thus, the switch may be characterized as being power conservative.

In addition to being power conservative, the disclosed switch features rapid power turn on, emergency power cut off and is capable of being operative in its on state over relatively long periods of time.

BRIEF DESCRIPTION OF THE DRAWING

These and other objects and features of the invention will become apparent to those skilled in the art after reading the detailed description herein in conjunction with the Drawing. The Drawing depicts circuit 100 which incorporates one embodiment of a power conservative time delay cut-off switch suitable for use in accordance with the teachings of the invention.

DETAILED DESCRIPTION

Circuit 100 depicts a power source 101, load 103 and the structure of a power conservative time delay cut-off switch.

Power source 101 is shown comprised of two series connected batteries, 102-A and 102-B. One side of the power source is shown grounded via lead 150. A power tap is shown at the junction of leads 151, 152 and 167 which supplies a voltage less than the full power supply potential to lead 167. The full power supply potential is output on lead 153.

Load 103 is shown comprised of a load resistor 115 grounded via lead 160. Load 103 is coupled to the switch via lead 159.

The switch is shown comprised of a switch 104 coupled between power source 101 (via leads 153 and 101) and load 103 (via leads 162 and 159). In the illustrated embodiment of the invention switch 104 is a momentary contact type switch.

The switch is shown further comprised of a bipolar transistor 106 having its collector-emitter junction connected in parallel with switch 104. The load is enabled to receive power via transistor 106 for as long as the transistor is in its conductive state.

The illustrative embodiment of the switch also includes an F.E.T. depicted in the Drawing as device 107. Lead 167 couples the source of F.E.T. 107 to the power source tap for biasing the F.E.T.

Whenever the potential on the gate of F.E.T. 107 (lead 168) is sufficient for the F.E.T. to be conductive, transistor 106 is rendered conductive. Thus, whenever F.E.T. 107 is conductive power flows from power source 101 to load 103 via transistor 106. Whenever the potential on the gate of F.E.T. 107 is below the F.E.T. cut-off voltage transistor 106 is rendered non-conductive. Thus, whenever F.E.T. 107 is non-conductive power is prevented from reaching load 103 via transistor 106. F.E.T. 107 controls the state of transistor 106 via its drain coupling to transistor 106 on leads 163, 165, resistor 110 and lead 166. To reiterate, F.E.T. 107 drains base current from transistor 106 (turning and keeping it on) via resistor 110 for as long as transistor 107 is conductive. Otherwise, both devices are non-conductive and no power reaches the load.

Resistor 109, connected to the emitter of transistor 106 via leads 155 and 156 and connected to the base of transistor 106 via leads 163 and 164, is employed in the switch to pull the base of transistor 106 to its emitter potential for as long as the switch is in the off state. Resistor 109 should be chosen to have a value greater than resistor 110 to effectively prevent transistor 106 from being turned on while the switch is in the off state.

The Drawing shows a capacitor 108 coupled to F.E.T. 107 via leads 168-170 and resistor 111. Capacitor 108 is assumed to have zero volts across it when switch 104 is closed to initiate the on state. Thus, except for the drop in potential across resistor 111, the voltage at the gate of F.E.T. 107 is essentially the power source potential appearing on lead 153 momentarily after switch 104 is closed. This gate voltage at initialization of the on state is what drives F.E.T. 107 into saturation. In turn, transistor 106 is rendered conductive virtually immediately. As soon as transistor 106 is conductive, switch 104 may be released since power will continue to flow to the load via transistor 106. Once transistor 106 is conductive the switch is in its on state.

Capacitor 108 is further shown coupled to receive full power source potential via leads 157 and 171. The full power source potential is on leads 157 and 171 whenever transistor 106 is conductive. Capacitor 108 is further coupled to resistor 112, of relatively high impedance, via leads 170, 172, 173 and 178. Capacitor 108 is normally charged through resistor 112. Resistor 112 is grounded via lead 179.

The combination of the characteristics of capacitor 108 and resistor 112 principally determine the time period over which the potential on the gate of F.E.T. 107 is maintained above the cut-off point for the F.E.T. Obviously, the time period for maintaining F.E.T. 107 conductive may be varied by the selection of a capacitor and resistor combination suitable with the circuit designer's requirements.

Switch 105, grounded by lead 176 and connected to capacitor 108 via leads 170, 172, 174, resistor 113 and lead 175, is an emergency power turn-off switch. Switch 105 is assumed to remain open unless an emergency dictates immediately cutting power off from the load. Resistor 113 is chosen to have a much lower impedance than resistor 112 so that capacitor 108 charges rapidly through resistor 113 whenever switch 105 is closed. In turn, the gate potential on F.E.T. 107 drops rapidly to effect the desired quick cut-off of the F.E.T. 107. Since transistor 106 is rendered non-conductive in response to F.E.T. 107 going non-conductive, power is quicly prevented from reaching the load in the emergency situation.

Finally, circuit 100 depicts capacitor 108 connected to ground via leads 170, 172, 173, 177, diode 114 and lead 180. This is the discharge path for the capacitor (through the load). When the switch enters the off state any charge on capacitor 108 developed during the on state is dissipated.

It should be understood that the choice of an F.E.T. for device 107 is for illustrative purposes only. Device 107 could be a bipolar transistor or indeed any other switching device capable of performing transistor like switching. However, the choice of an F.E.T. allows the switch to be maintained in the on state for a relatively long time interval. This is because of the relatively high input impedance of F.E.T.s as compared with, for example, bipolar transistors.

It should be observed that whenever the switch is in the off state no closed circuits exist which include the power source. Transistors 106 and 107 are both non-conductive in the off state of the switch. In addition, switches 104 and 105 are always open in the off state of the switch. Thus, the switch draws absolutely no power from the power source in the off state and is therefore power conservative.

The following components and specific circuit values are set forth for illustration purposes only and are not in any way intended to limit the invention. These devices and circuit values have been utilized to actually build a working power conservative time delay cut-off switch in accordance with the teachings herein and are set forth to aid in teaching the invention.

Power source 101 may be realized by two series connected 9 volt batteries corresponding to batteries 102-A and 102-B. Devices 106 and 107 may be realized by a 2N4121 transistor and a TIS75 F.E.T., respectively. Suitable values for resistors R1 through R5 are 33K ohms, 15K ohms, 11M ohms, 11M ohms again and 4.7K ohms, respectively. A 47 microfarad capacitor is suitable for use with the above listed components. Diode 114 may be realized by a 1N4149 diode. The load may obviously be any desired value. Finally, switches 104 and 105 may be realized by momentary contact type switches. All of the components listed above the depicted in the Drawing are readily obtainable from commercial sources.

Alternative embodiments exist where the power source is a single battery. In order that the switch depicted in the Drawing remain power conservative when operating off a single battery the requisite remains the same that all transistors be non-conductive and all switches be open when the switch is in the off state. This may be achieved, consistent with the switch depicted in the Drawing, by connecting a resistive divider network to lead 159 and tapping the divider with a lead going to the source of F.E.T. 107. Of course, lead 167 as shown in the Drawing would be removed from power source 101 since the power source is now assumed to consist of only a single battery with no tap point.

In this alternative embodiment, again, the switch is power conservative.

Finally, it should be observed that the switch depicted in the Drawing has a rapid turn-on feature. When switch 104 is closed the load is immediately powered via leads 163, 161, switch 104, lead 162 and lead 159. In addition, as described hereinbefore, essentially full battery potential is applied to the gate of transistors 107 as soon as switch 104 is closed. Thus, transistor 106 is virtually immediately turned on allowing switch 104 to open without a break in the power flow to load 103. The load is thus instantly powered and remains powered from the time when switch 104 is closed until the switch automatically cuts power some time later.

What has been described in detail above are examples of power conservative time delay cut-off switches featuring rapid power turn on, emergency power cut off and the capability of being maintained in their on states for relatively long periods of time. Various alternative embodiments will be apparent to those skilled in the art. However, the invention is intended to be limited only by the scope and spirit of the appended claims.

What is claimed is:

1. A power conservative time delay cut-off switch having a power on and power cut-off state for permitting a load to receive power from a power source for a predetermined event actuated period of time corresponding to the time that the switch is in the power on state and which draws no power in the power off state, comprising:
  a. a first switching device which has a conductive and a non-conductive state and includes input, output and control teminals, said input terminal being coupled to said power source and said output terminal being coupled to said load, for permitting power to reach said load while said device is in its conductive state;
  b. bias means;
  c. a second switching device which has a conductive and a non-conductive state and includes input, output and control terminals, said input terminal of said second device being coupled to said bias means and said output terminal of said second device being resistively coupled to the control terminal of said first device, for placing and maintaining said first device in the same conductivity state as said second device;
  d. means for providing a pulse of short duration to said second device to intially place said second device in its conductive state;
  e. means for storing an electric charge over said predetermined period which includes a first and second terminal, said first terminal being coupled to the output terminal of said first device and said second terminal being coupled, through a resistance of high impedance, to ground, for developing an electric charge for storage while said first device is in its conductive state; and
  f. means for varying the potential on the control terminal of said second device, coupled between said second device and said means for storing, directly as a function of the electric charge stored by said means for storing.

2. A power conservative time delay cut-off switch as set forth in claim 1 wherein said first switching device is a bipolar transistor which includes an emitter, base and collctor corresponding to the input, control and output terminals respectively of said first switching device.

3. A power conservative time delay cut-off switch as set forth in claim 1 wherein said second switching device is a field effect transistor having a source, gate and drain corresponding to the input, control and output terminals respectively of said second switching device.

4. A power conservative time delay cut-off switch as set forth in claim 1 wherein said means for storing is a capacitor.

5. A power conservative time delay switch as set forth in claim 1 wherein said means for providing a pulse of short duration is a momentary contact switch connected in parallel with said first switching device between said power source and said load.

6. A power conservative time delay cut-off switch as set forth in claim 1 further comprising:
  a. a grounded third switching device having a conductive and a non-conductive state; and
  b. a resistance of relatively low impedance series connected between said means for storing and said third device through which said means for storing may be rapidly charged whenever said third device is in its conductive state.

7. A power conservative time delay cut-off switch as set forth in claim 1 further comprising means for dissipating the electric charge stored on said means for storing whenever said switch enters its power cut-off state.

* * * * *